United States Patent
Liu et al.

(10) Patent No.: US 9,120,627 B2
(45) Date of Patent: Sep. 1, 2015

(54) GUIDE DEVICE FOR HARD WORKPIECE TRANSFER

(71) Applicant: Shenzhen China Star Optoelectronics Technology Co., Ltd., Shenzhen, Guangdong (CN)

(72) Inventors: Ming Liu, Guangdong (CN); Tao Song, Guangdong (CN); Tao Ma, Guangdong (CN); Guodong Zhao, Guangdong (CN); Fangfu Chen, Guangdong (CN); Tao Ding, Guangdong (CN); Yijun Liu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 296 days.

(21) Appl. No.: 13/824,384

(22) PCT Filed: Jan. 17, 2013

(86) PCT No.: PCT/CN2013/070575
§ 371 (c)(1),
(2) Date: Mar. 18, 2013

(87) PCT Pub. No.: WO2014/106360
PCT Pub. Date: Jul. 10, 2014

(65) Prior Publication Data
US 2014/0190795 A1    Jul. 10, 2014

(30) Foreign Application Priority Data

Jan. 5, 2013 (CN) .......................... 2013 1 0002253

(51) Int. Cl.
*B65G 15/08*        (2006.01)
*B65G 15/32*        (2006.01)
*B65G 15/46*        (2006.01)
*B65G 49/06*        (2006.01)
*B65G 15/28*        (2006.01)

(Continued)

(52) U.S. Cl.
CPC ................ *B65G 15/28* (2013.01); *B65G 15/08* (2013.01); *B65G 15/32* (2013.01); *B65G 15/40* (2013.01); *B65G 15/42* (2013.01); *B65G 15/46* (2013.01); *B65G 39/06* (2013.01); *B65G 49/061* (2013.01); *B65G 49/063* (2013.01); *B65G 49/064* (2013.01); *H01L 21/67706* (2013.01); *B65G 2207/28* (2013.01)

(58) Field of Classification Search
CPC ........ B65G 15/46; B65G 15/40; B65G 15/42; B65G 15/08; B65G 15/32; B65G 49/06; B65G 49/063
See application file for complete search history.

(56) References Cited

U.S. PATENT DOCUMENTS 3,332,537 A * 7/1967 Davidson ...................... 198/819
3,595,378 A * 7/1971 Kamisaka ..................... 198/819

(Continued)

*Primary Examiner* — Mark A Deuble

(57) ABSTRACT

A guide device for hard workpiece transfer is provided, comprising a buffer belt for carrying the hard workpiece, a pilot wheel for driving the buffer belt to move, and a drive device for controlling the pilot wheel to rotate, with the buffer belt being made of elastic materials. With the buffer belt made of elastic materials carrying such hard workpieces as glass to be transferred, when the guide device is in contact with the hard workpiece to be transferred, the buffer belt is pressed to deform, which can reduce the pressure produced during the contact of the guide device with the hard workpiece, and prevent the contact portion from being broken or worn because of the pressure, not only preventing loss of the hard workpiece to be transferred, but also reducing use consumption of the guide device, thereby reducing the material cost.

6 Claims, 4 Drawing Sheets

(51) Int. Cl.
*B65G 15/40* (2006.01)
*B65G 15/42* (2006.01)
*B65G 39/06* (2006.01)
*H01L 21/677* (2006.01)

(56) References Cited

U.S. PATENT DOCUMENTS

| | | | | |
|---|---|---|---|---|
| 4,030,728 | A * | 6/1977 | Wallace et al. | 271/277 |
| 4,410,082 | A * | 10/1983 | McGinnis | 198/818 |
| 4,662,510 | A * | 5/1987 | Oakley et al. | 198/819 |
| 6,029,801 | A * | 2/2000 | Odin et al. | 198/847 |
| 6,180,210 | B1 * | 1/2001 | Debus | 428/167 |
| 6,935,486 | B2 * | 8/2005 | Davis | 198/781.02 |
| 7,261,201 | B2 * | 8/2007 | Tachibana et al. | 198/791 |
| 7,992,705 | B2 * | 8/2011 | Shiga | 198/781.11 |
| 2003/0034229 | A1 * | 2/2003 | Fishaw et al. | 198/781.06 |
| 2006/0177297 | A1 * | 8/2006 | Jung et al. | 414/749.1 |
| 2011/0039481 | A1 * | 2/2011 | Hiraga et al. | 451/102 |

* cited by examiner

GUIDE DEVICE FOR HARD WORKPIECE TRANSFER

FIELD OF THE INVENTION

The present invention relates to the field of devices for workpiece transfer, particularly to a guide device for hard workpiece transfer.

BACKGROUND OF THE INVENTION

Currently, glass is usually used as the display substrate in the field of display. In the process flow of formation of the display, basically a guide device is needed for each operation, so as to prevent the glass from deviating when the glass is transferred in the related process, help the glass to move forward, and also support the glass to a certain extent.

However, the vast majority of guide devices currently used in the industry are often made of nylon, plastic steel, PE, UPE and other materials that generally have a relatively high hardness, and glass as the same hard material is often ruptured by mutual collision when in contact therewith, with the edge of glass also easy to be worn to form fragmented microparticles. On the other hand, the portion of the guide device in contact with the glass may also produce indention because of impact and friction with the glass. Therefore, not only a great damage is caused to the glass, but also the cost of maintaining the guide device is increased.

CONTENTS OF THE INVENTION

The object of the present invention is to provide a guide device for hard workpiece transfer, aiming at reducing the impact and wear between the hard workpieces such as glass and the guide device during the transfer of the hard workpieces.

In order to solve the above technical problem, a guide device for hard workpiece transfer is provided, comprising a buffer belt for carrying the hard workpiece, a pilot wheel for driving the buffer belt to move, and a drive device for controlling the pilot wheel to rotate, with the buffer belt being made of elastic materials.

Advantageousy, the buffer belt is provided with a clamping portion for clamping the hard workpiece.

Advantageously, the clamping portion includes a tooth-like bulge at both ends of the buffer belt, with the middle portion of the buffer belt being a deformation zone; when the hard workpiece presses the deformation zone of the buffer belt during the transfer, both ends of the buffer belt close up to the middle, until the inner side of the tooth-like bulge at both ends of the buffer belt completely fits the hard workpiece.

Advantageously, the clamping portion includes an occlusal pad respectively bonded to both ends of the buffer belt, with the middle portion of the buffer belt being a deformation zone; when the hard workpiece presses the deformation zone of the buffer belt during the transfer, both ends of the buffer belt drives the occlusal pad to close up to the middle, until the inner side of the occlusal pad completely fits the hard workpiece.

Advatageously, there is a descending slope respectively from both ends of the buffer belt to the middle, and the deformation zone of the buffer belt is formed by two intersecting slopes, with the inner side of the occlusal pad being a slope.

Advantageously, the buffer belt is a plane, with the inner side of the occlusal pad being a plane.

Advantageously, the occlusal pad is made of antiskid materials.

Advantageously, the width of the deformation zone of the buffer belt is close to the thickness of the workpiece.

Advantageously, the drive device is a drive shaft, to which the pilot wheel is fixed, with the buffer belt muff-coupled to at least two pilot wheels.

Advantageously, the drive device is a chain, to which the pilot wheel is fixed, with the buffer belt respectively bonded to the single pilot wheel.

On the other hand, a guide device for hard workpiece transfer is also provided, comprising a buffer belt for carrying the hard workpiece, a pilot wheel for driving the buffer belt to move, and a drive device for controlling the pilot wheel to rotate, the buffer belt being provided with a clamping portion for clamping the hard workpiece, with the buffer belt being made of elastic materials.

Advantageously, the clamping portion includes a tooth-like bulge at both ends of the buffer belt, with the middle portion of the buffer belt being a deformation zone; when the hard workpiece presses the deformation zone of the buffer belt during the transfer, both ends of the buffer belt close up to the middle, until the inner side of the tooth-like bulge at both ends of the buffer belt completely fits the hard workpiece.

Advantageously, the clamping portion includes an occlusal pad respectively bonded to both ends of the buffer belt, with the middle portion of the buffer belt being a deformation zone; when the hard workpiece presses the deformation zone of the buffer belt during the transfer, both ends of the buffer belt drives the occlusal pad to close up to the middle, until the inner side of the occlusal pad completely fits the hard workpiece.

The embodiments of the present invention have the following beneficial effects: With the buffer belt made of elastic materials carrying such hard workpieces as glass to be transferred, when the guide device is in contact with the hard workpiece to be transferred, the buffer belt is pressed to deform, which can reduce the pressure produced during the contact of the guide device with the hard workpiece, and prevent the contact portion from being broken or worn because of the pressure, not only preventing loss of the hard workpiece to be transferred, but also reducing use consumption of the guide device, thereby reducing the material cost.

BRIEF DESCRIPTIONS OF THE DRAWINGS

For explaining the examples of the present invention or the technical solutions of the existing technology more clearly, the drawings needing to be used in the examples or existing technology will be described briefly in the following. Obviously, the drawings below are only some examples of the present invention, according to which those of ordinary skill in the art can also obtain other drawings without an inventive effort.

DETAILED DESCRIPTION OF THE EMBODIMENTS

The technical solution of the embodiments of the present invention will be described clearly and completely in the following with reference to the drawings of the embodiments of the present invention. Obviously, the embodiments described are only part instead of all of the embodiments of the present invention, and all the other embodiments obtained by those of ordinary skill in the art based on the embodiments of the present invention without an inventive effort fall within the scope of protection of the present invention.

Figure 1:
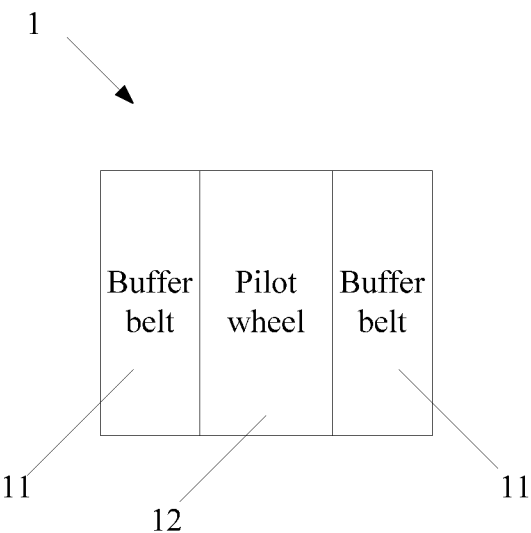
FIG. 1 is a schematic diagram of the guide device for hard workpiece transfer according to the first embodiment of the present invention.

FIG. 1 is a side view of the guide device 1 for transfer of such hard workpieces as glass according to the first embodiment of the present invention. The guide device 1 includes a buffer belt 11 for carrying such hard workpieces as glass, a pilot wheel 12 for driving the buffer belt to move, and a drive device for controlling the pilot wheel to rotate (not shown in the drawing). Wherein the buffer belt 11 is made of elastic materials, which can be for embodiment Teflon, toughening rubber and PTFE, or gasbag-like materials, so long as the material is inclined to produce elastic deformation under the action of pressure.

The present invention provides a guide device for hard workpieces, wherein with the buffer belt 11 made of elastic materials carrying such hard workpieces as glass to be transferred, when the guide device is in contact with the hard workpiece to be transferred, the buffer belt 11 is pressed to deform, which can reduce the pressure produced during the contact of the guide device with the hard workpiece, and prevent the contact portion from being broken or worn because of the pressure, not only preventing loss of the hard workpiece to be transferred, but also reducing use consumption of the guide device, thereby reducing the material cost.

In the embodiment as shown in FIG. 1, although the buffer belt 11 can prevent impact while carrying the hard workpiece, the carried hard workpiece is inclined to make displacement due to inertia during the transfer; because the friction produced due to displacement can also lead to wear of the portion in contact, in order to overcome this defect, the buffer belt 11 can be provided with a clamping portion for clamping the hard workpiece. The embodiment of the guide device provided with the clamping portion will be described below with reference to FIGS. 2-4.

Figure 2:
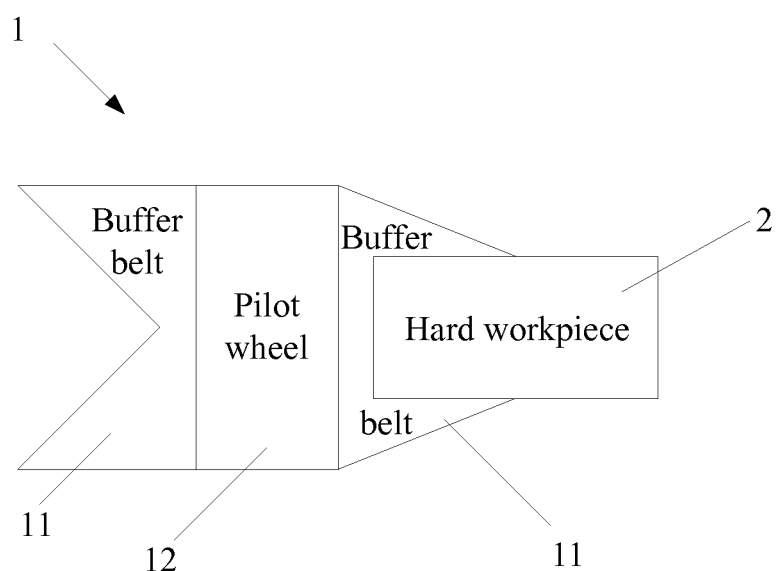
FIG. 2 is a schematic diagram of the guide device for hard workpiece transfer according to the second embodiment of the present invention.

FIG. 2 is a schematic diagram of the guide device for hard workpiece transfer according to the second embodiment of the present invention. As shown in FIG. 2, both ends of the buffer belt 11 are tooth-like bulges, whose inner side can be a slope. The middle portion of the buffer belt 11 is a deformation zone, which is in complete contact with one side of the hard workpiece 2 and can be either a cutting plane or a plane formed by intersected inner sides of the tooth-like bulge at the upper and lower ends. The clamping portion includes the tooth-like bulge at both ends of the buffer belt 11; when the hard workpiece 2 presses the deformation zone of the buffer belt 11 during the transfer, both ends of the buffer belt 11 close up to the middle due to elastic deformation of the deformation zone, until the inner side of the tooth-like bulge at both ends of the buffer belt 11 completely fits the hard workpiece 2, thereby clamping the hard workpiece 2. Specifically, when the deformation zone of the buffer belt 11 is a cutting plane, the thickness of the hard workpiece 2 to be processed is preferably bigger than the width of this cutting plane; that is, the hard workpiece 2 is preferably to press to the slope of the buffer belt 11, so as to make the buffer belt 11 produce larger deformation to make the tooth-like bulge easier to be closed up.

Figure 3:
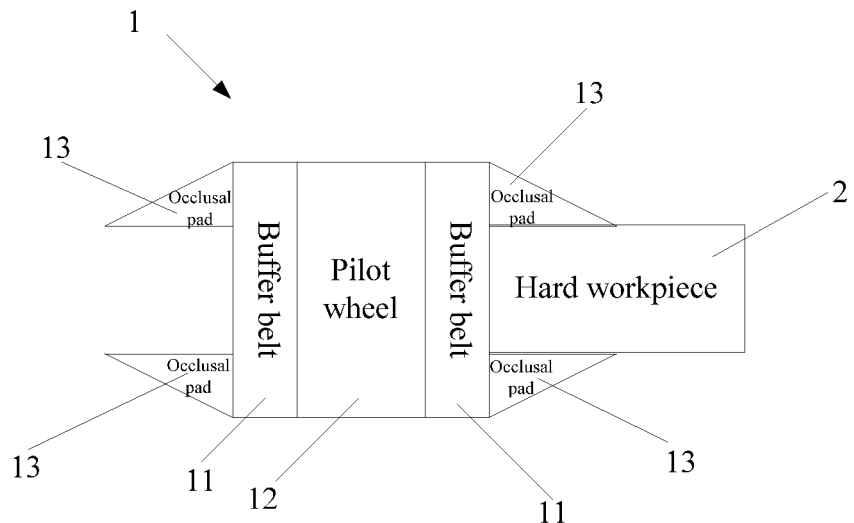
FIG. 3 is a schematic diagram of the guide device for hard workpiece transfer according to the third embodiment of the present invention.

FIG. 3 is a schematic diagram of the guide device for transfer of the hard workpiece 2 according to the third embodiment of the present invention. As shown in FIG. 3, the buffer belt 11 is a plane; the clamping portion includes an occlusal pad 13 respectively bonded to both ends of the buffer belt 11; the middle of the buffer belt 11 where no occlusal pad 13 is bonded is a deformation zone, which is in complete contact with one side of the hard workpiece 2. The inner side of the occlusal pad 13 is a plane almost in parallel with the hard workpiece 2 placed therebetween; the outer side of the occlusal pad 13 is a slope; when the hard workpiece 2 presses the middle portion of the buffer belt 11 during the transfer, both ends of the buffer belt drive the occlusal pad 13 to slightly close up to the middle due to slight elastic deformation of the deformation zone, until the inner side of the occlusal pad 13 completely fits the hard workpiece 2.

In the embodiment as shown in FIG. 3, because the deformation zone is a plane, the deformation zone produces small deformation when the hard workpiece 2 presses, making the occlusal pad 13 not easy to close up to the middle due to deformation of the buffer belt 11, and therefore the buffer belt 11 (particularly the deformation zone of the buffer belt 11) is preferably to be made into a slope. This embodiment will be described in detail with reference to FIG. 4.

Figure 4:
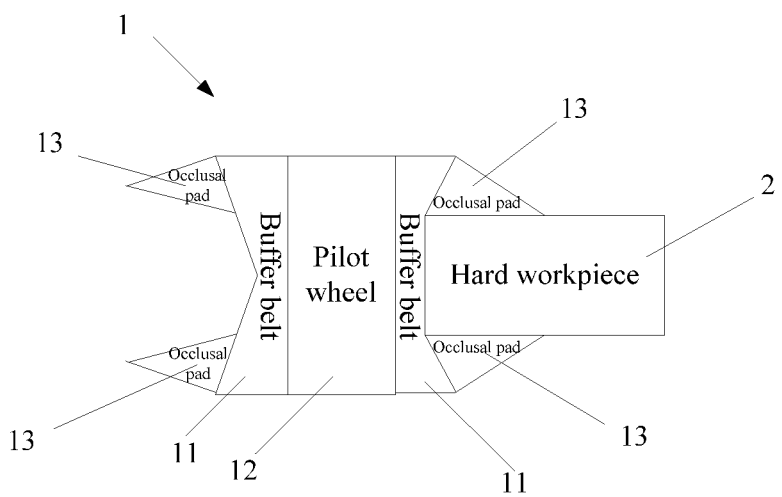
FIG. 4 is a schematic diagram of the guide device for hard workpiece transfer according to the fourth embodiment of the present invention.

FIG. 4 is a schematic diagram of the guide device for transfer of the hard workpiece 2 according to the fourth embodiment of the present invention. As shown in FIG. 4, there is a descending slope respectively from both ends of the buffer belt 11 to the middle. The middle portion of the buffer belt 11 is a deformation zone that is formed by two intersecting slopes. The clamping portion includes an occlusal pad 13 respectively bonded to both ends of the buffer belt 11, with the inner side of the occlusal pad 13 as a slope. When the hard workpiece 2 presses the deformation zone of the buffer belt 11 during the transfer, both ends of the buffer belt 11 drive the occlusal pad 13 to close up to the middle due to elastic deformation of the deformation zone, until the inner side of the occlusal pad 13 completely fits the hard workpiece 2.

In the embodiment as shown in FIGS. 3 and 4, in order to reduce the friction between the hard workpiece 2 and the guide device, the occlusal pad 13 is made of antiskid materials (e.g. antiskid rubber).

In the embodiment as shown in FIGS. 3 and 4, because the occlusal pad 13 may not have good elasticity, the width of the deformation zone (i.e. the middle of the buffer belt 11 where no occlusal pad 13 is bonded) of the buffer belt 11 is close to the thickness of the workpiece 2, especially when the deformation zone is pressed into a plane.

In the embodiment as shown in FIG. 4, in order to reduce the length of the occlusal pad 13, the outer side of the occlusal pad 13 is also a slope.

Figure 5:
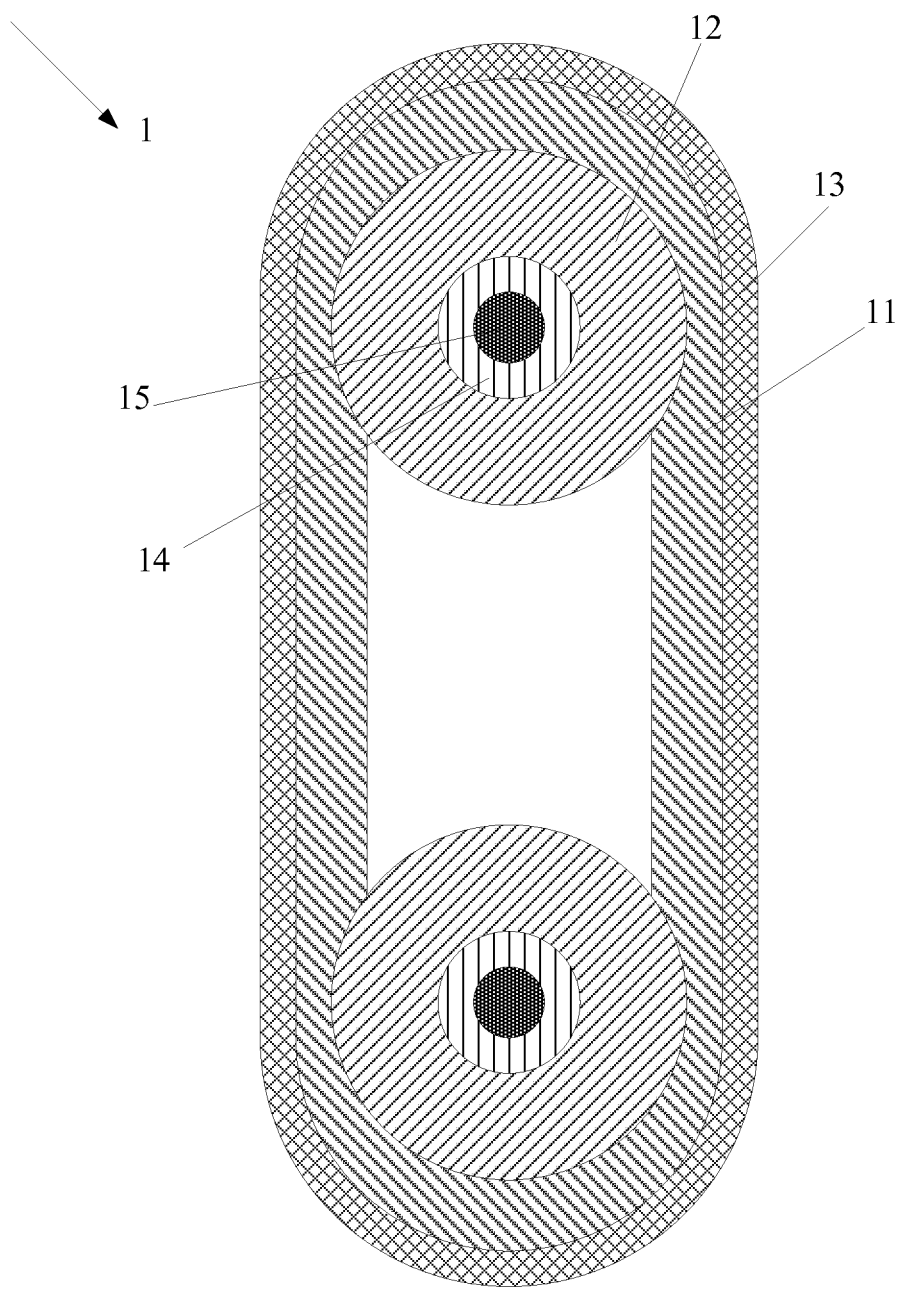
FIG. 5 is a schematic diagram of the guide device according to any of the first to fourth embodiments of the present invention in another direction.

FIG. 5 is a schematic diagram of the guide device according to any of the first to fourth embodiments of the present invention in another direction. Wherein the drive device 14 is a drive shaft, to which the pilot wheel 12 is fixed through a fixing nut 15, with the buffer belt 11 muff-coupled to at least two pilot wheels 12. The drive shaft drives the pilot wheel 12 to rotate, thus making the buffer belt 11 transmit in a particular direction, thereby guiding the hard workpiece clamped by the pilot wheel.

Figure 6:
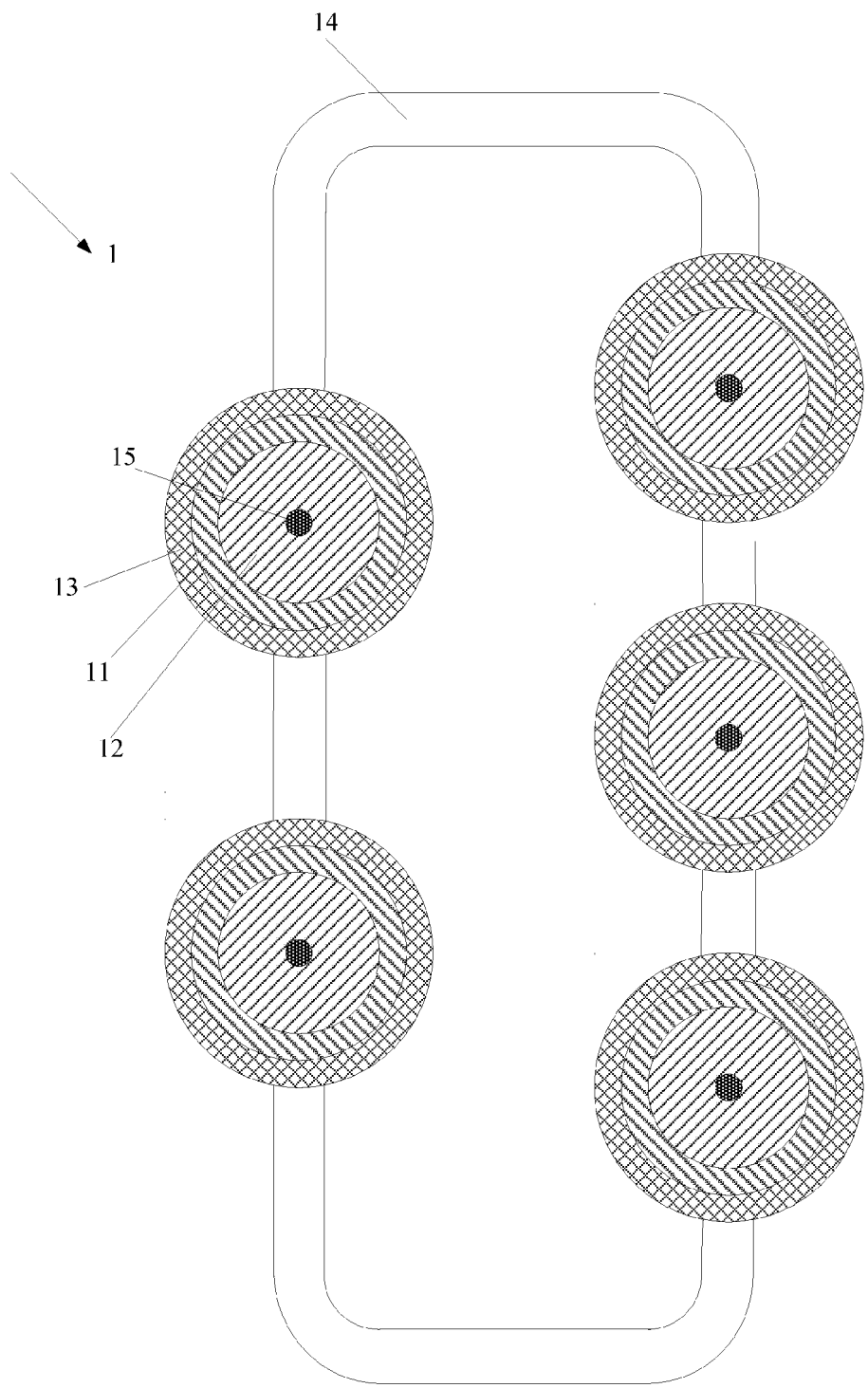
FIG. 6 is a schematic diagram of the guide device according to any of the first to fourth embodiments of the present invention in another direction.

FIG. 6 is a schematic diagram of the guide device according to any of the first to fourth embodiments of the present invention in another direction. Wherein the drive device 14 is a chain, to which is fixed the pilot wheel 12 through a fixing nut 15, with the buffer belt 11 bonded to each of the pilot wheels 12, respectively. The chain transmits toward a specific direction, driving the pilot wheel 12 fixed on it to move toward a specific direction, thereby guiding the hard workpiece clamped by the pilot wheel 12.

The present invention can be applied to the field of display manufacture, and the hard workpiece as described above is a glass substrate of the manufactured display; when the glass substrate presses the deformation zone in the middle of the buffer belt, both top ends of the buffer belt will be driven to close up to the middle, i.e. the top end at the upper and lower ends will be bent to close up to the upper and lower faces of the glass substrate; while with an occlusal pad of antiskid materials (e.g. the antiskid rubber) added to the upper and lower ends of the buffer belt, when both ends of the buffer belt close up to both sides of the glass substrate, the antiskid occlusal pad at both ends will get in plane-contact with the surface of the glass substrate, thus clamping the glass substrate to move forward together, which reduces the relative movement of the glass substrate, and thus prevents deviation of the glass substrate during the transfer and friction between the glass substrate and the guide wheel, thereby preventing production of particles and damage of the guide wheel and greatly reducing the cost.

The above disclosure only contains several preferred embodiments of the present invention, and certainly cannot thereby limit the scope of protection of the present invention. Those of ordinary skill in the art can understand all or part of procedures of the above embodiments, and equivalent changes made according to the present invention still fall within the scope of the present invention.

The invention claimed is:

1. A guide device for hard workpiece transfer, comprising a buffer belt for carrying a hard workpiece, a pilot wheel for driving the buffer belt to move, and a drive device for controlling the pilot wheel to rotate, wherein the buffer belt is made of elastic materials; the buffer belt is provided with a clamping portion for clamping the hard workpiece; the clamping portion includes an occlusal pad respectively bonded to both ends of the buffer belt, with a middle portion of the buffer belt as a deformation zone; when the hard workpiece presses the deformation zone of the buffer belt during the transfer, both ends of the buffer belt drives the occlusal pad to close up to the middle, until the inner side of the occlusal pad completely fits the hard workpiece; there is a descending slope respectively from both ends of the buffer belt to the middle; the deformation zone of the buffer belt is formed by two intersecting slopes, with the inner side of the occlusal pad being a slope.

2. The guide device of claim 1, wherein the buffer belt is a plane, with the inner side of the occlusal pad being a plane.

3. The guide device of claim 1, wherein the occlusal pad is made of antiskid materials.

4. The guide device of claim 3, wherein the width of the deformation zone of the buffer belt is close to the thickness of the workpiece.

5. The guide device of claim 1, wherein the drive device is a drive shaft, to which the pilot wheel is fixed, with the buffer belt wound around at least two pilot wheels.

6. The guide device of claim 1, wherein the drive device is a chain, to which the pilot wheel is fixed, with the buffer belt respectively bonded to the single pilot wheel.

\* \* \* \* \*